United States Patent
Lim et al.

(10) Patent No.: US 7,081,872 B2
(45) Date of Patent: Jul. 25, 2006

(54) MICROMIRROR DEVICE USING INTERDIGITATED CANTILEVERS AND APPLICATIONS THEREOF

(75) Inventors: Koeng Su Lim, Daejeon (KR); Jun-Bo Yoon, Daejeon (KR); Jin-Wan Jeon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 391 days.

(21) Appl. No.: 10/105,281

(22) Filed: Mar. 26, 2002

(65) Prior Publication Data
US 2003/0048244 A1    Mar. 13, 2003

(30) Foreign Application Priority Data
Sep. 13, 2001    (KR) ............................... 2001-56449

(51) Int. Cl.
G09G 3/34    (2006.01)
G02B 26/00   (2006.01)

(52) U.S. Cl. ........................................ 345/85; 359/224
(58) Field of Classification Search ............ 345/84–85; 359/290–292, 295, 223–225; 385/15, 17, 385/18, 119
See application file for complete search history.

(56) References Cited

U.S. PATENT DOCUMENTS

| | | | | |
|---|---|---|---|---|
| 5,535,047 A | | 7/1996 | Hornbeck | 359/295 |
| 6,191,883 B1* | | 2/2001 | Huffman et al. | 359/291 |
| 6,220,561 B1* | | 4/2001 | Garcia | 248/487 |
| 2002/0001122 A1* | | 1/2002 | Ko et al. | 359/298 |
| 2002/0025106 A1* | | 2/2002 | Raccio | 385/18 |

FOREIGN PATENT DOCUMENTS

EP    1 0990966 A2 *   5/2001

* cited by examiner

Primary Examiner—Alexander Eisen
(74) Attorney, Agent, or Firm—Oliff & Berridge, PLC

(57) ABSTRACT

Disclosed are a micromirror device made in a simple structure using interdigitated cantilevers and having two stable rotational states, and applications thereof. The micromirror device comprises: (a) a substrate; (b) at least two protruded support posts arranged protrudedly in two columns of left and right sides on the substrate and apart by a predetermined interval from each other; (c) multiple cantilevers formed in parallel with the substrate, each having one end attached at the upper end portion of the respective protruded support posts and made in a thin strip having an elastic restoring force, wherein the cantilevers adjacent to each other are arranged to be parallel and interdigitated; (d) mirror support posts coupled to upper portions of the other ends of the cantilevers; (e) a mirror attached on upper portions of the whole mirror support posts and supported by the mirror support posts; and (f) two electrodes formed at left and right sides on the substrate, for providing an electrostatic force to the mirror, wherein the micromirror device reflects light incident into the mirror in different directions from each other by using an electrostatic force due to a voltage applied between the electrodes and the mirror, and the elastic restoring force of the cantilevers. The micromirror device can drive the mirror in two directions and adjust a rotational angle of the mirror using the electrostatic force due to a potential difference between the electrodes and the mirror for reflecting incident light, and the elastic restoring force of the cantilevers.

14 Claims, 11 Drawing Sheets

MICROMIRROR DEVICE USING INTERDIGITATED CANTILEVERS AND APPLICATIONS THEREOF

BACKGROUND OF THE INVENTION

1. Field of the Invention

The present invention relates to a micromirror device, and more particularly, to a micromirror device made in a simple structure using interdigitated cantilevers and having bistable rotational states, and applications thereof.

2. Background of the Invention

Typical micromirror devices for image display are two-dimensionally arranged on a substrate on which an addressing circuit is fabricated, and are driven by electrostatic force to reflect incident light at a predetermined angle. These micromirror devices can be utilized in optical information processing, image display devices, such as projection displays, video and graphics monitors, television, or optical scanning devices such as copiers.

One example of conventional micromirror devices is disclosed in U.S. Pat. No. 5,535,047 which was issued to Larry J. Hornbeck on 9 Jul. 1996. FIG. 1 is an exploded perspective view of a conventional micromirror device for image display. Referring to FIG. 1, on an addressing circuitry is disposed a first layer including a yoke address electrode 10 and a landing site 11. On the first layer is disposed a second layer supported by an address support post 12 and including a mirror address electrode 13, a torsion hinge 14, and a yoke 15 directly contacted with a mirror 17. The mirror 17 is disposed on the second layer and is coupled with the yoke 15 through a mirror support post 16. Thus, the micromirror device is comprised of four layers including the addressing circuitry, and includes the support post for supporting the mirror address electrode layer, the support post for supporting the mirror, the yoke connected to the mirror, the torsion hinge, one yoke address electrode for applying a voltage between the yoke address electrode and the mirror, and two address electrodes for driving the mirror.

FIG. 2 is a cross sectional view of the micromirror device of FIG. 1 taken along a center line of the length direction of the hinge, and shows a connection state of the mirror 17, the yoke 15, the hinge 14 and the respective layers. Referring to FIG. 2, the mirror 17 is connected to the yoke 15 through the mirror support post 16. The hinge 14 is disposed beneath the yoke 15 and serves as a rotational shaft. The address electrode 10 is connected with the support post 12, and after it is processed to form an addressing circuitry, it is also connected to a substrate 6 partially coated with a passivation oxide film 8.

FIGS. 3A and 3B are cross sectional views of rotating appearances of the mirror taken along a line normal to the center line of the length direction of the hinge. In FIGS. 3A and 3B, reference numerals of elements that are not related with description of the art are intentionally omitted. When a potential difference is applied between the mirror 17 and the one electrode 10, the mirror 17 is rotated in one direction by the electrostatic force as shown in FIG. 3A, and after it is rotated by a predetermined angle, it is collided with the landing site 11 and is then stopped. On the other hand, when a voltage is applied between the mirror 17 and the other electrode 10, the mirror 17 is rotated in an opposite direction as shown in FIG. 3B. Thus, the mirror 17 has bistable condition, and a reflecting angle of the light becomes different depending on the two rotational states of the mirror. Accordingly, by changing a traveling path of the light that is incident from a constant direction with the micromirror, it is possible to allow the light to be incident into a lens (not shown) and a screen (not shown) or to be deviated from the screen.

As described above, since the conventional micromirror device is comprised of the mirror, the yoke, the hinge, and the respective support posts, and thus has a complicated structure, there is a disadvantage in that too many processes are requested in order to fabricate the micromirror device. Hence, there are difficulties in driving the mirror at a constant power, and fabricating the mirror, so that fabrication cost becomes high.

Further, in the conventional micromirror device, since the mirror is always rotated in two directions of the left direction and the right direction by suitable voltages applied to the mirror address electrode, the hinge is always in a distorted state. Since such an operation is carried out by a pair of thin hinges, rigidity of the hinges acts as a main factor determining a characteristic of the mirror.

SUMMARY OF THE INVENTION

Therefore, the present invention has been devised to solve the above problems, and it is an object of the present invention to provide a micromirror device having a bistable rotational state with a simplified structure.

It is another object of the invention to provide an optical switching element capable of being realized in a simple structure with an appliance of the above micromirror device.

It is still another object of the invention to provide an image display device capable of displaying a high definite image with an appliance of the above micromirror device.

To achieve the aforementioned object of the present invention, there is provided a micromirror device comprising: (a) a substrate; (b) at least two protruded support posts arranged protrudedly in two columns of left and right sides on the substrate and apart by a predetermined interval from each other; c) multiple cantilevers formed in parallel with the substrate, each having one end attached at the upper end portion of the respective protruded support posts and made in a thin strip having an elastic restoring force, wherein the cantilevers adjacent to each other are arranged to be parallel and interdigitated; (d) mirror support posts coupled to upper portions of the other ends of the cantilevers; (e) a mirror attached on upper portions of the whole mirror support posts and supported by the mirror support posts; and (f) two electrodes formed at left and right sides on the substrate, for providing an electrostatic force to the mirror, wherein the micromirror device reflects light incident into the mirror in different directions from each other by using an electrostatic force due to a voltage applied between the electrodes and the mirror, and the elastic restoring force of the cantilevers.

To achieve the another object of the invention, there is provided an optical switching device comprising: light input means; the aforementioned micromirror device, for reflecting light outputted from the light input means in different two directions; and two light output means for outputting the light reflected by the micromirror device.

When only one micromirror device is used, it is possible to realize 1×2 optical switching element. Also, when arrayed micromirror devices are used, it is possible to realize a optical multi-switching device.

To achieve the still another object of the invention, there is provided an image display device comprising: (a) a light source; (b) two-dimensionally arrayed micromirror devices, each micromirror device having the same structure as the aforementioned micromirror device; (c) a driving circuit for applying an electrical signal to electrodes of the arrayed micromirror devices such that light incident upon the arrayed micromirror devices is selectively reflected along a first path and a second path; (d) a color filter for revealing colors corresponding to pixels when the light reflected along the first path passes through the color filter; (e) a screen for displaying an image by using the light that passes through the color filter; and (f) a light absorbing plate for absorbing the light reflected along the second path.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
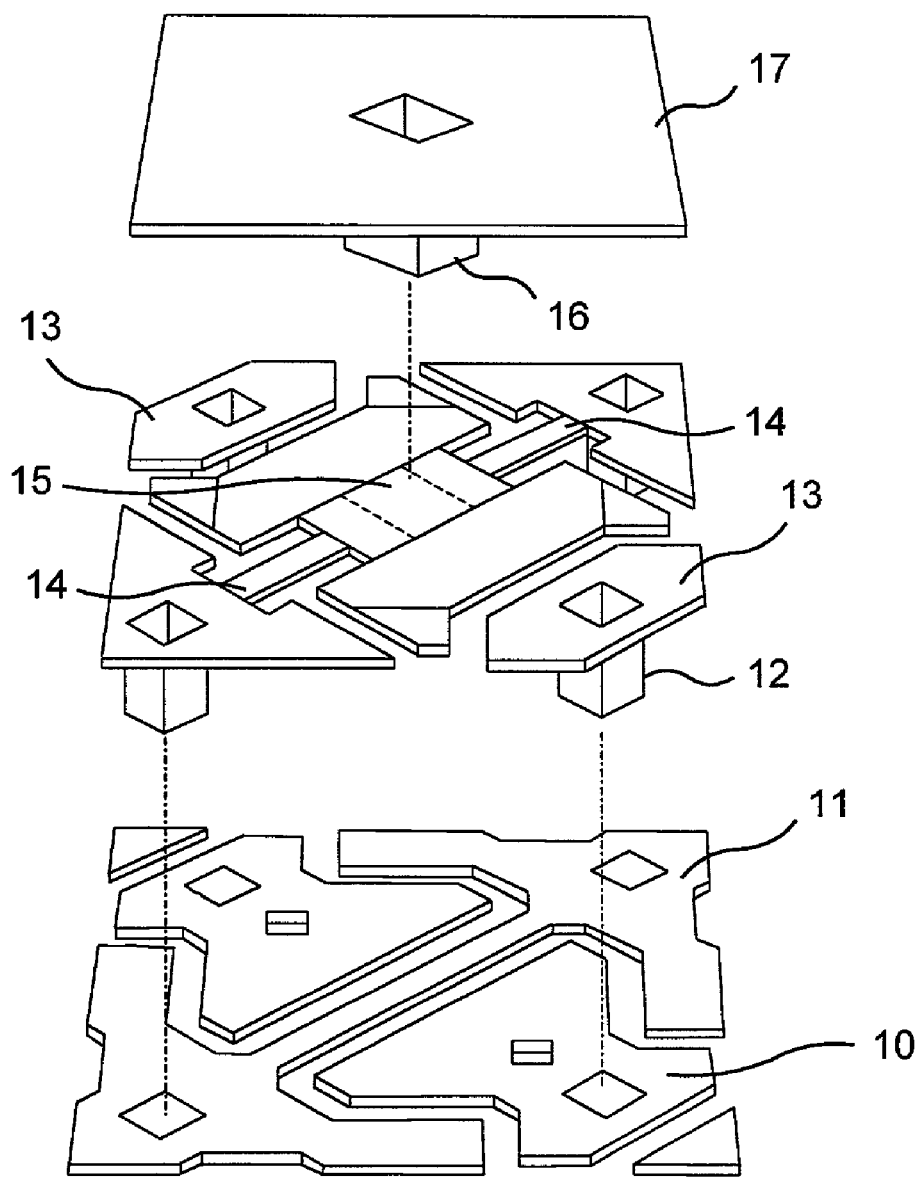
FIG. 1 is an exploded perspective view of a conventional micromirror device for image display.
Figure 2:
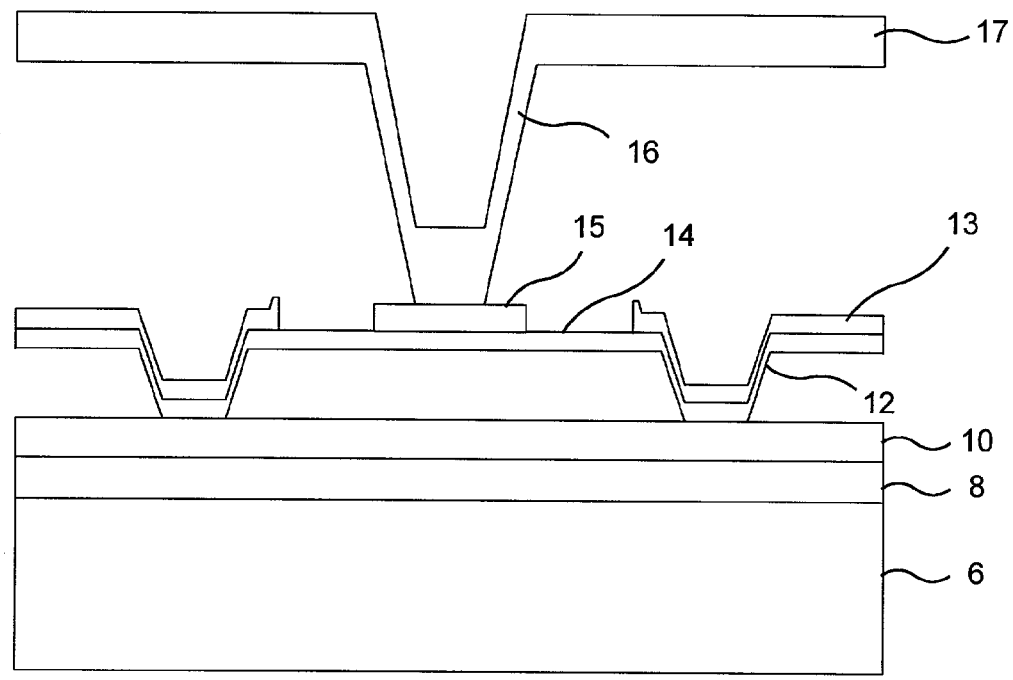
FIG. 2 is a cross sectional view of the micromirror device of FIG. 1 taken along a center line of a length direction of a hinge.
Figure 3A:
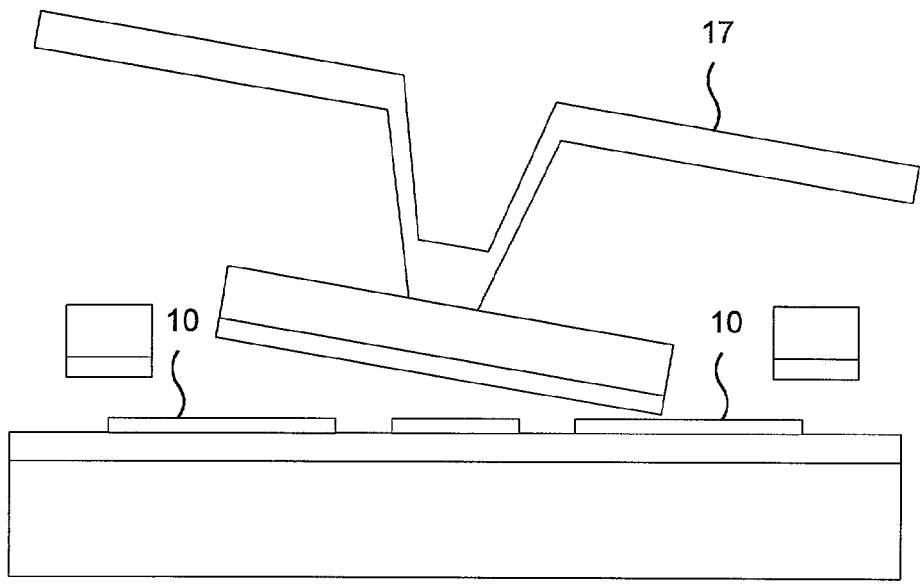
FIGS. 3A and 3B are cross sectional views of rotating appearances of the mirror taken along the center line of the length direction of the hinge and a line vertical to the length direction.
Figure 3B:
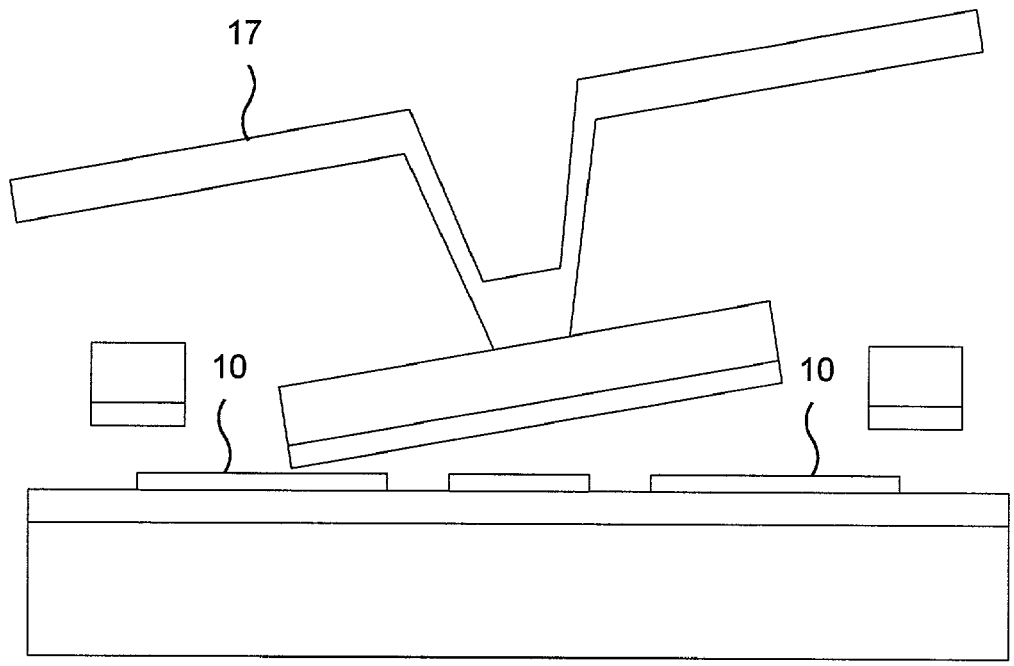

Now, preferred embodiments of the present invention will be described in detail with reference to the annexed drawings. Herein, same components are represented as same reference numerals and repeated description will be omitted.

Figure 4:
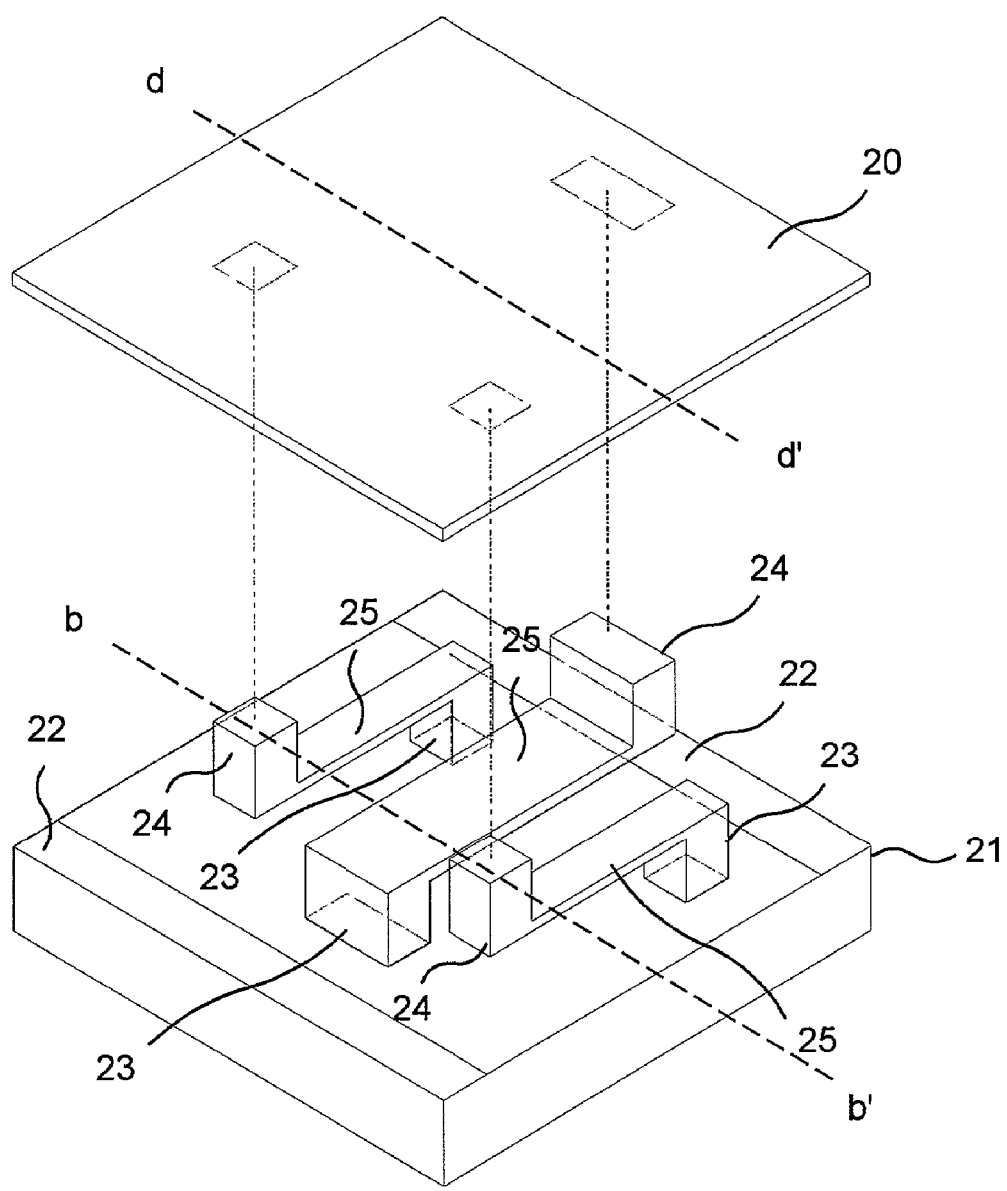
FIG. 4 is an exploded perspective view of a micromirror device for image display in accordance with one embodiment of the present invention.

FIG. 4 is an exploded perspective view of a micromirror device for image display in accordance with one embodiment of the present invention. Referring to FIG. 4, the micromirror device includes a substrate 21 on which an addressing circuitry is formed, electrodes 22 formed on the substrate 21, three protruded support posts 23 attached on the substrate 21, three cantilevers 25 with their respective one ends attached to and supported by the respective protruded support posts 23, three mirror support posts 24 respectively attached on the other ends of the respective cantilevers 25, and a mirror 20 attached on upper end portions of mirror support posts 24. Each cantilever 25 is made in a thin strip. The three protruded support posts 23 are positioned such that protruded support posts supporting adjacent cantilevers are alternately attached on the substrate 21 at opposite positions with respect to a center line b–b' of the substrate 21. The cantilevers 25 are interdigitatedly arranged in parallel with each other. Accordingly, the three mirror support posts 24 are positioned such that mirror support posts attached on adjacent cantilevers are alternately attached to the mirror 20 at opposite positions with respect to a center line b–b' of the substrate 21. The thin strip-shaped cantilevers 25 connecting the protruded support posts 23 with the mirror support posts 24 are subject to an expansion and contraction stresses by electrostatic force due to a voltage applied to the electrodes 22 arranged on the substrate 21, and thereby are upward or downward warped, thereby rotating the mirror 20. In addition, since the three cantilevers 25 are interdigitated and the fixing positions of the protruded support posts 23 to the substrate 21 and the attaching positions of the mirror support posts 24 are alternately determined at opposite positions, this micromirror device has two rotational states in which the mirror 20 is declined by a predetermined angle toward either left direction or right direction depending on an application direction of the electrostatic force. To this end, it is possible to adjust a rotational angle of the mirror 20 depending on the strength of the electrostatic forces as applied. The pair of addressing electrodes 22 for driving the mirror 20 and the cantilevers 25 for applying a voltage to the mirror 20 are respectively connected to the addressing circuitry (not shown) formed on the substrate 21.

In the micromirror device shown in FIG. 4, the centered cantilever has a larger size than the two outer cantilevers with considering the forces applied to the mirror 20 by the electrodes 22 and the mirror support posts 24. Of course, these cantilevers can be made in more many numbers in a smaller size. In this case, the multiple cantilevers are interdigitatedly arranged to realize two rotational states. When the number of the cantilevers is an even number, in order to balance the forces applied to the mirror, all the cantilevers preferably have the same size. When the number of the cantilevers is an odd number, a centered cantilever is preferably made larger in size than the remaining cantilevers, and the remaining cantilevers are made to have the same size.

Figure 5:
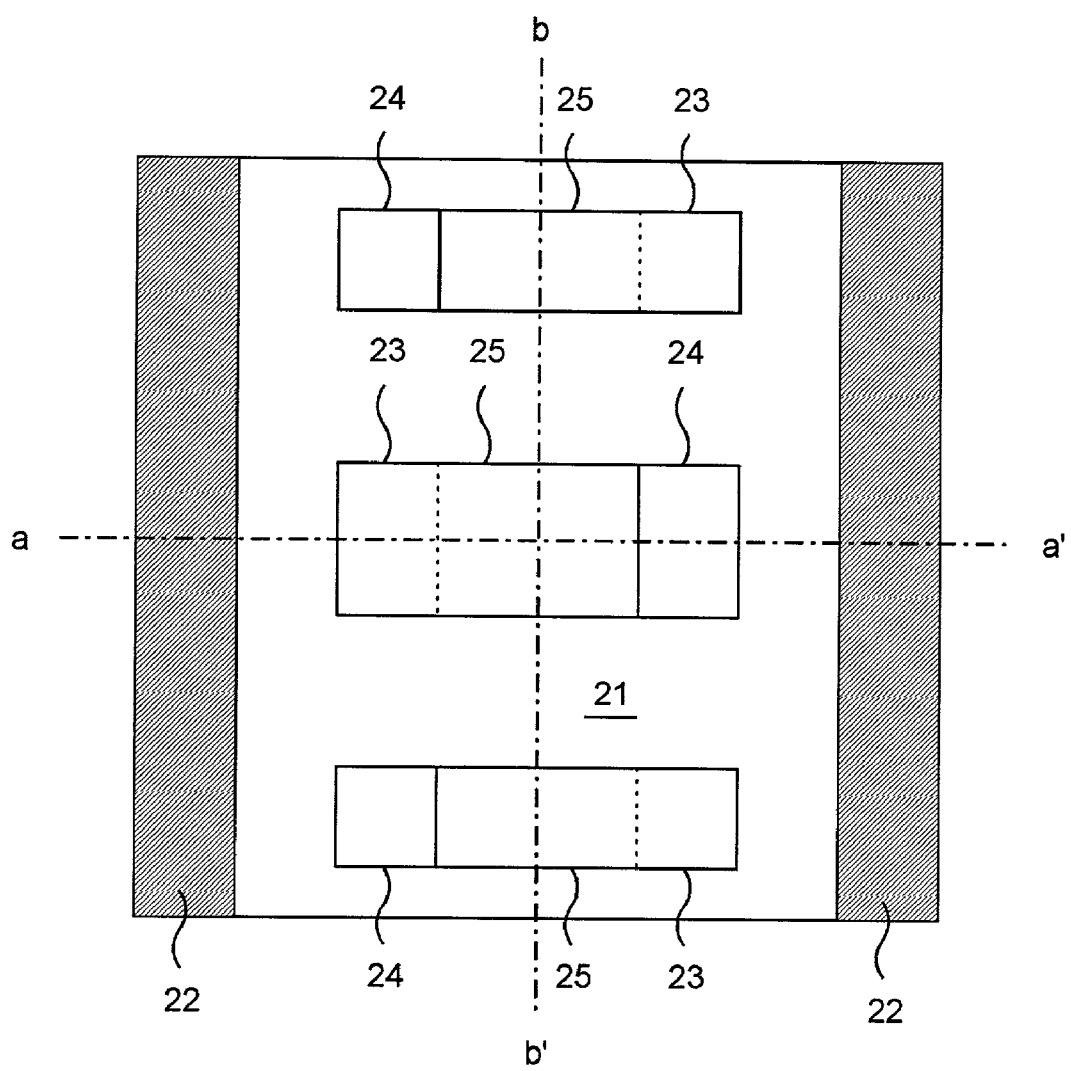
FIG. 5 is a plan view of the micromirror device of FIG. 4 from which the mirror is removed and which is viewed from a position over the substrate.

FIG. 5 is a plan view of the micromirror device of FIG. 4 from which the mirror is removed and which is viewed from a position over the substrate. Referring to FIG. 5, the protruded support posts 23 for supporting the cantilevers 25, and the mirror support posts 24 for supporting the mirror are symmetrically arranged with respect to a horizontal center line a–a' of the substrate 21. The mirror addressing electrodes 22 are symmetrically formed with respect to a vertical center line b–b' of the substrate 21. In this plan view, the electrodes 22 are formed not to be overlapped with the protruded support posts 23. By the above structure, the mirror 20 is subject to a controlled force with respect to the rotating two directions, and accordingly can have the two rotational states.

Figure 6A:
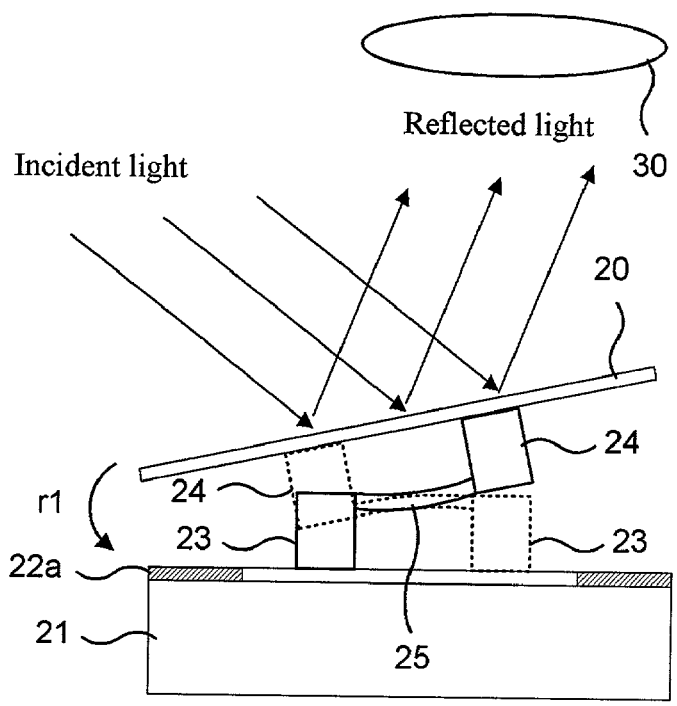
FIGS. 6A and 6B are schematic views showing rotationally driven status of the mirror in the micromirror device in accordance with the embodiment of the present invention.
Figure 6B:
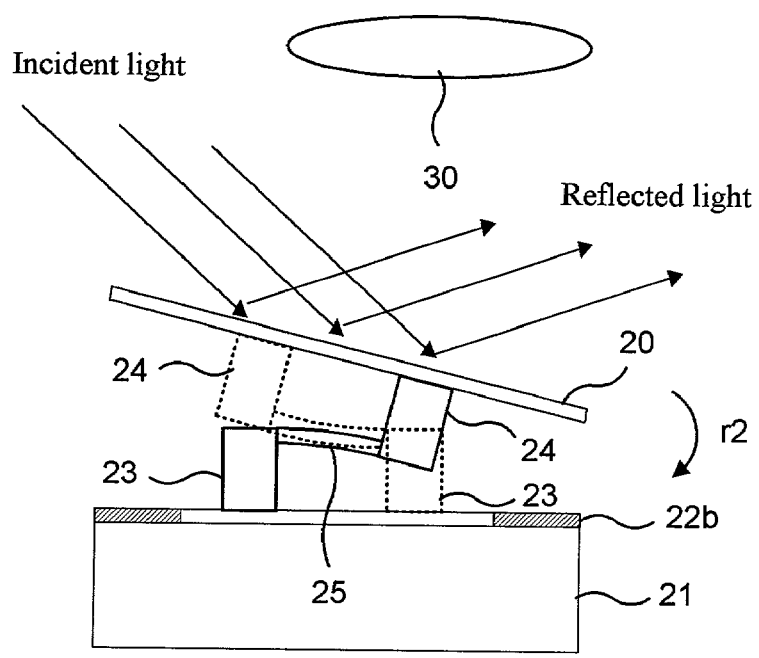

FIGS. 6A and 6B are schematic cross sectional views showing rotationally driven status of the mirror in the micromirror device shown in FIG. 4, and are taken along the center line of the length direction of the centered cantilever.

As shown in FIG. 6A, as a predetermined voltage is applied between the left electrode 22a and the mirror 20 and thereby electrostatic force is generated between the left electrode 22a and the mirror 20, the mirror 20 is rotated in a direction indicated by an arrow r1. At this time, the two mirror support posts placed at the left side among the mirror support posts 24 attached to the mirror 20 are dropped to the left lower side and thus is subject to an elastic restoring force by the cantilevers 25 connected to the mirror 20. At the same time, one mirror support post attached to the right side of the mirror 20 is elevated upward at the right side, and thereby the cantilever 25 connected thereto is also subject to an elastic restoring force. As a result, the mirror becomes declined to a position in which the electrostatic force and the elastic restoring force maintain an equilibrium state. At this time, incident light is reflected by the mirror 20 and travels toward a screen (not shown) through a lens 30.

Referring to FIG. 6B, as a predetermined voltage is applied between the right electrode 22b and the mirror 20, the mirror 20 is rotated in a direction indicated by an arrow r2. At this time, one mirror support post placed at the right side among the mirror support posts 24 supporting the mirror 20 is dropped to the left lower side and the remaining two mirror support posts placed at the left side are elevated upward at the left side. Since the protruded support posts placed on the substrate 21 are fixed, the cantilevers 25 are subject to an elastic restoring force by the aforementioned operation. In the case shown in FIG. 6, incident light is reflected by the mirror 20 but does not travel toward the screen (not shown) through the lens As described above, the three interdigitated cantilevers provide a large elastic restoring force and support the mirror stably when the mirror 20 is declined from a horizontal state. Also, if the protruded support posts protruded upward from the substrate are made longer than the mirror support posts supporting the mirror, the mirror is collided by the protruded support posts and thereby a further rotation of the mirror becomes impossible, so that a damage of the mirror due to a contact with the electrodes is prevented and the mirror comes to have a precise rotational angle.

Figure 7:
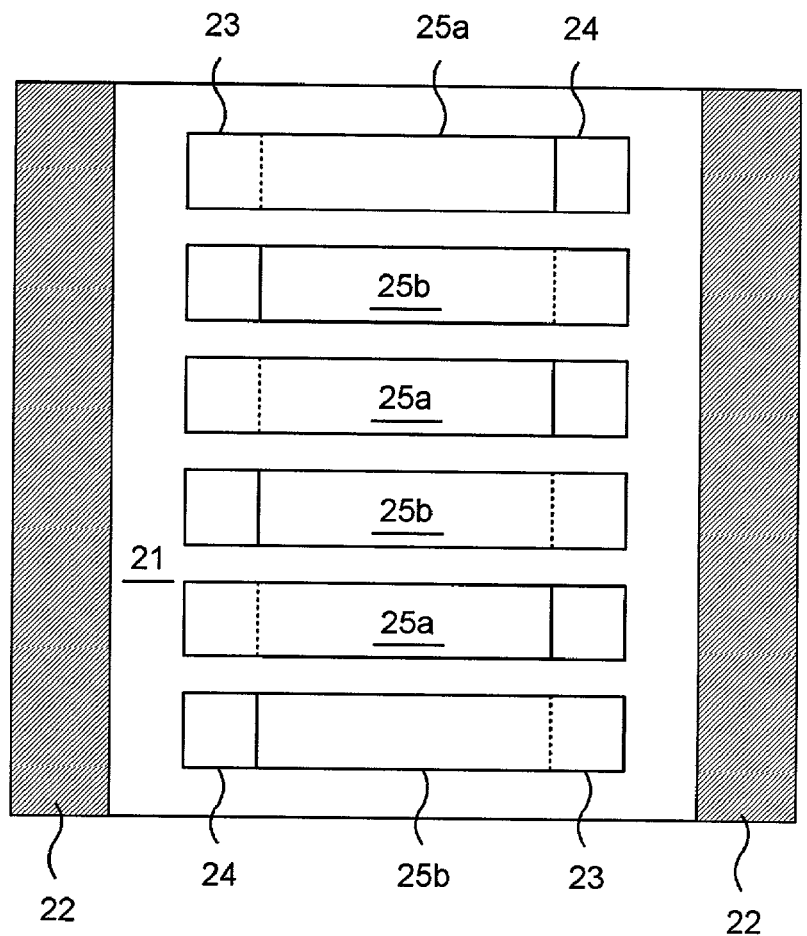
FIG. 7 is a plan view of a micromirror device in accordance with another preferred embodiment of the present invention, from which the mirror is removed and which is viewed from a position over the substrate.

FIG. 7 is a plan view of a micromirror device in accordance with another preferred embodiment of the present invention, from which the mirror is removed and which is viewed from a position over the substrate. When comparing the structure of FIG. 7 with that of FIG. 5, the structure of FIG. 7 has a difference in that multiple interdigitated smaller-sized cantilevers 25a and 25b support the mirror. The reference numerals 25a and 25b are sorted depending on their direction, i.e., the cantilevers having the same direction are sorted into the same reference numeral. Referring to FIG. 7, the micromirror device includes a substrate 21 on which an addressing circuitry is formed, electrodes 22 formed on the substrate 21, multiple protruded support posts 23 attached on the substrate 21, multiple smaller-sized cantilevers 25 with their respective one ends attached to and supported by the respective protruded support posts 23, mirror support posts 24 respectively attached on the other ends of the respective cantilevers 25, and a mirror 20 attached on upper end portions of mirror support posts 24. Each cantilever 25 is made in a thin strip. The protruded support posts 23 are positioned such that protruded support posts supporting adjacent cantilevers are alternately attached on the substrate 21 at opposite positions with respect to a center line b–b' of the substrate 21. The cantilevers 25 are interdigitatedly arranged in parallel with each other. Accordingly, the mirror support posts 24 are positioned such that mirror support posts attached on adjacent cantilevers are alternately attached to the mirror 20 at opposite positions with respect to a center line b–b' of the substrate 21. The interdigitated cantilevers 25 provide the mirror 20 with an elastic restoring force when the mirror 20 is declined by a predetermined angle from an equilibrium state, and they may have a variety of shapes. Thus, use of the multiple cantilevers enables to disperse the load supporting the mirror, to enhance the elastic restoring force, and also to drive the mirror in two rotational states.

Figure 8A:
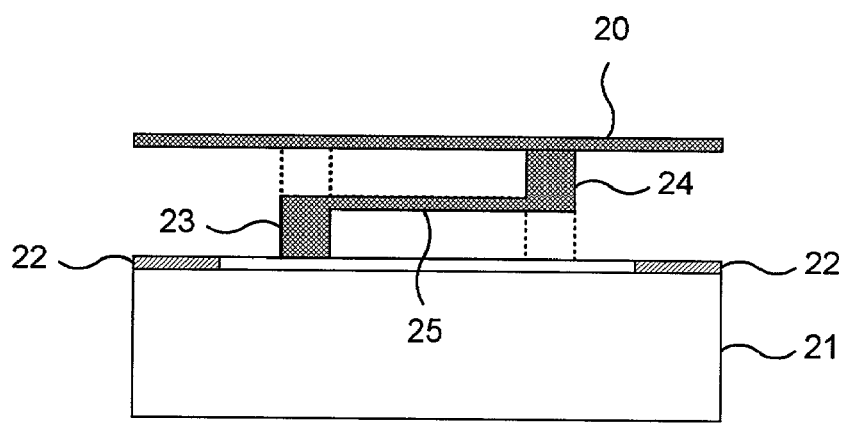
FIGS. 8A and 8B are cross sectional views of mirrors employed in the micromirror devices in accordance with the embodiments of the present invention.
Figure 8B:
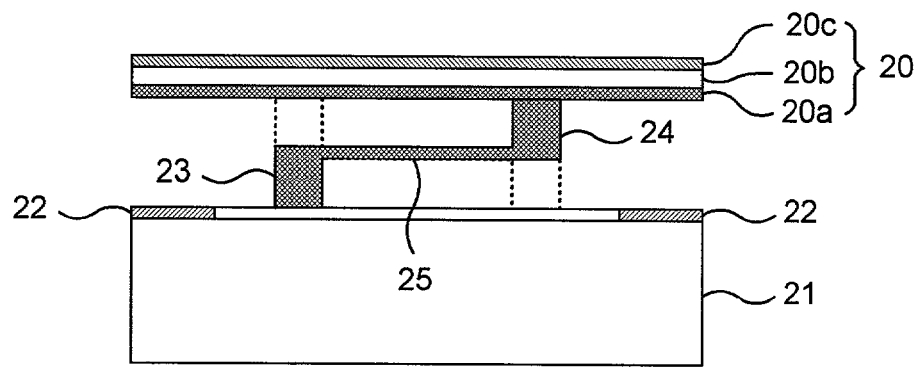

FIGS. 8A and 8B are cross sectional views of mirrors employed in the micromirror devices in accordance with the embodiments of the present invention.

As shown in FIG. 8A, the mirror 20 can be made of a metal alone capable of reflecting light. Or, as shown in FIG. 8B, the mirror 20 can be made of a multi-layered structure using conductive materials and metal with high reflectance. For instance, a lower conductive layer 20a and the mirror supporting structure including the mirror support posts 24, the cantilevers 25 and the protruded support posts 23 are made of a conductive material such as nickel (Ni) or polycrystalline silicon (Poly-Si), while middle and upper layers 20b and 20c are made in a dual layered structure of Al or Ag metal layers having a high reflectance.

Figure 9A:
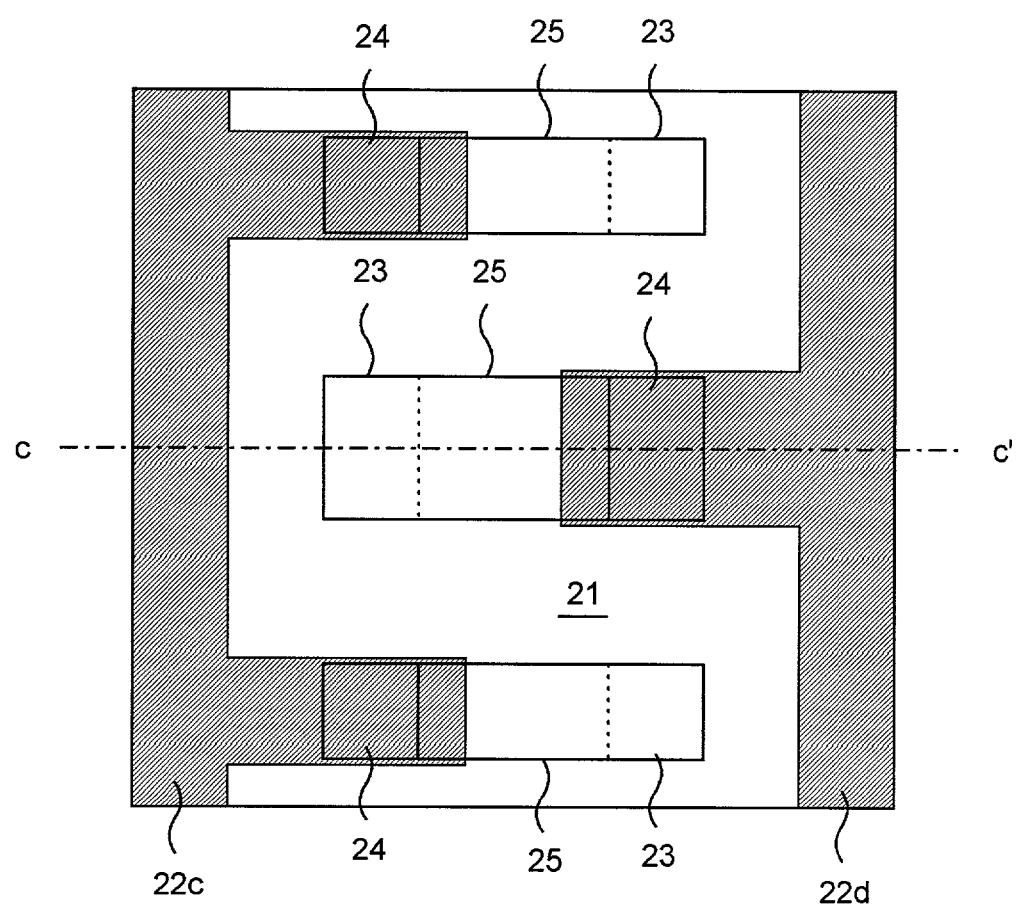
FIGS. 9A and 9B are plan view and sectional view showing an electrode structure for decreasing a driving voltage in the micromirror device in accordance with the embodiment of the present invention.
Figure 9B:
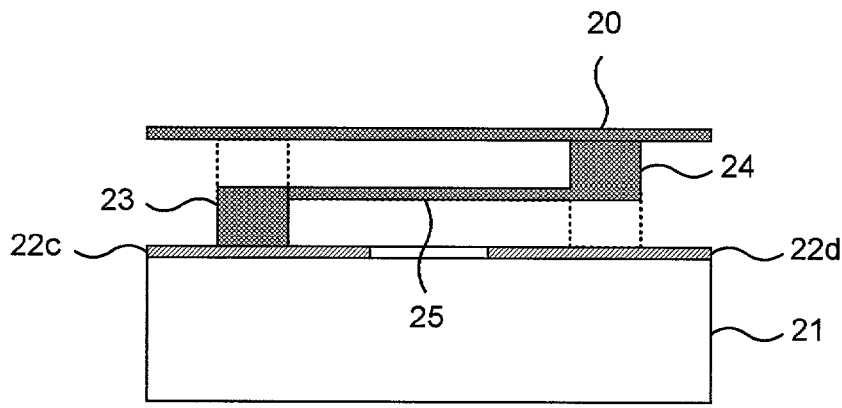

FIGS. 9A and 9B are plan view and sectional view showing an electrode structure for decreasing a driving voltage in the micromirror device in accordance with the embodiment of the present invention, respectively.

Referring to FIG. 9A, the structure of FIG. 9A is basically the same as that of FIG. 5 but it has a difference in that electrodes 22c and 22d formed on the substrate are extended below the cantilevers 25. In this structure, since the cantilevers 25 connected to the mirror support posts 24 for supporting the mirror can carry out functions as the electrodes, the extended electrodes 22c and 22d cause a result to place the electrodes for generating the electrostatic force closer. In other words, the structure of FIG. 5 generates the electrostatic force due to a potential difference between the mirror and the electrodes formed on the substrate, while the structure of FIG. 9A generates the electrostatic force due to a potential difference between the cantilevers 25 and the electrode 22c or 22d formed on the substrate. Then, in the structures having an identical potential difference, the less the spacing between the electrodes, the greater electrostatic force is generated. Accordingly, as shown in FIG. 9A, the change in the arrangement between the electrodes and the cantilevers can decrease the driving voltage.

FIG. 9B is a cross sectional view taken along the line of c–c' in FIG. 9A.

These micromirror devices may be applied as optical switching elements in the optical network system. In these appliances, since it is possible to form two output direction with respect to one input, they can be realized as an 1×2 optical switching element.

Figure 10A:
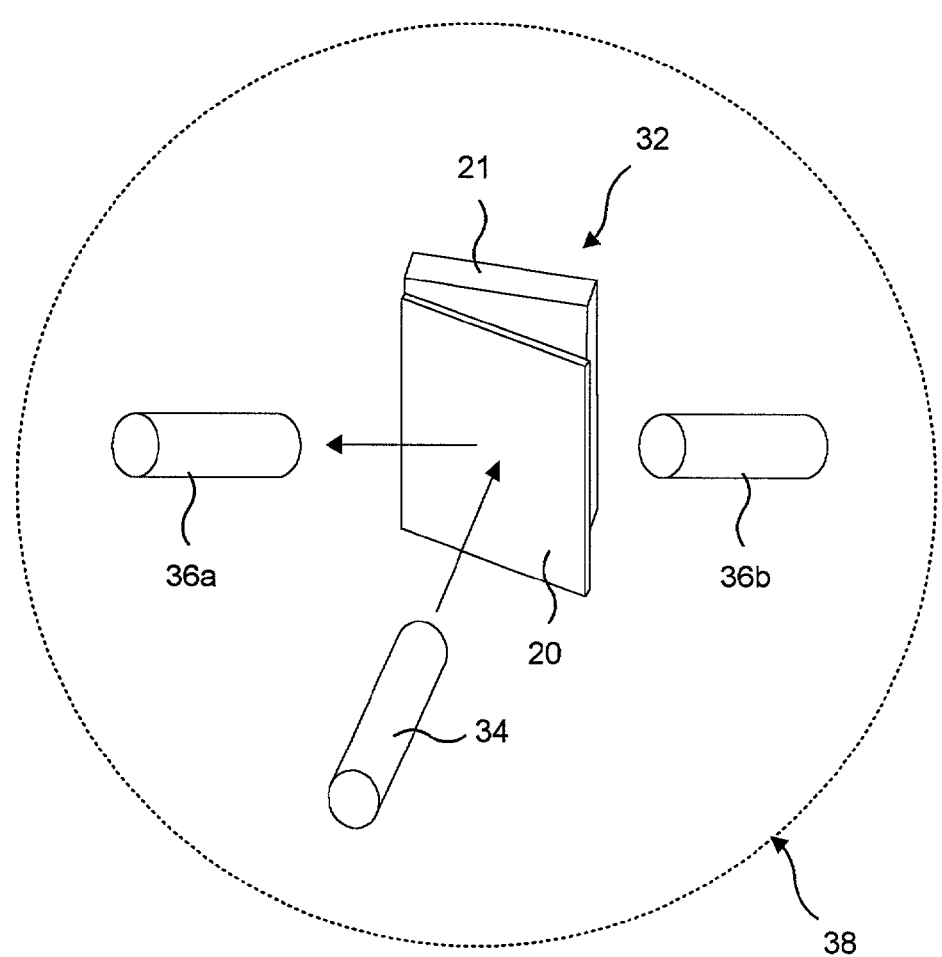
FIGS. 10A and 10B are views for illustrating an operation of an 1×2 optical switching device employing the micromirror device in accordance with another embodiment of the present invention.
Figure 10B:
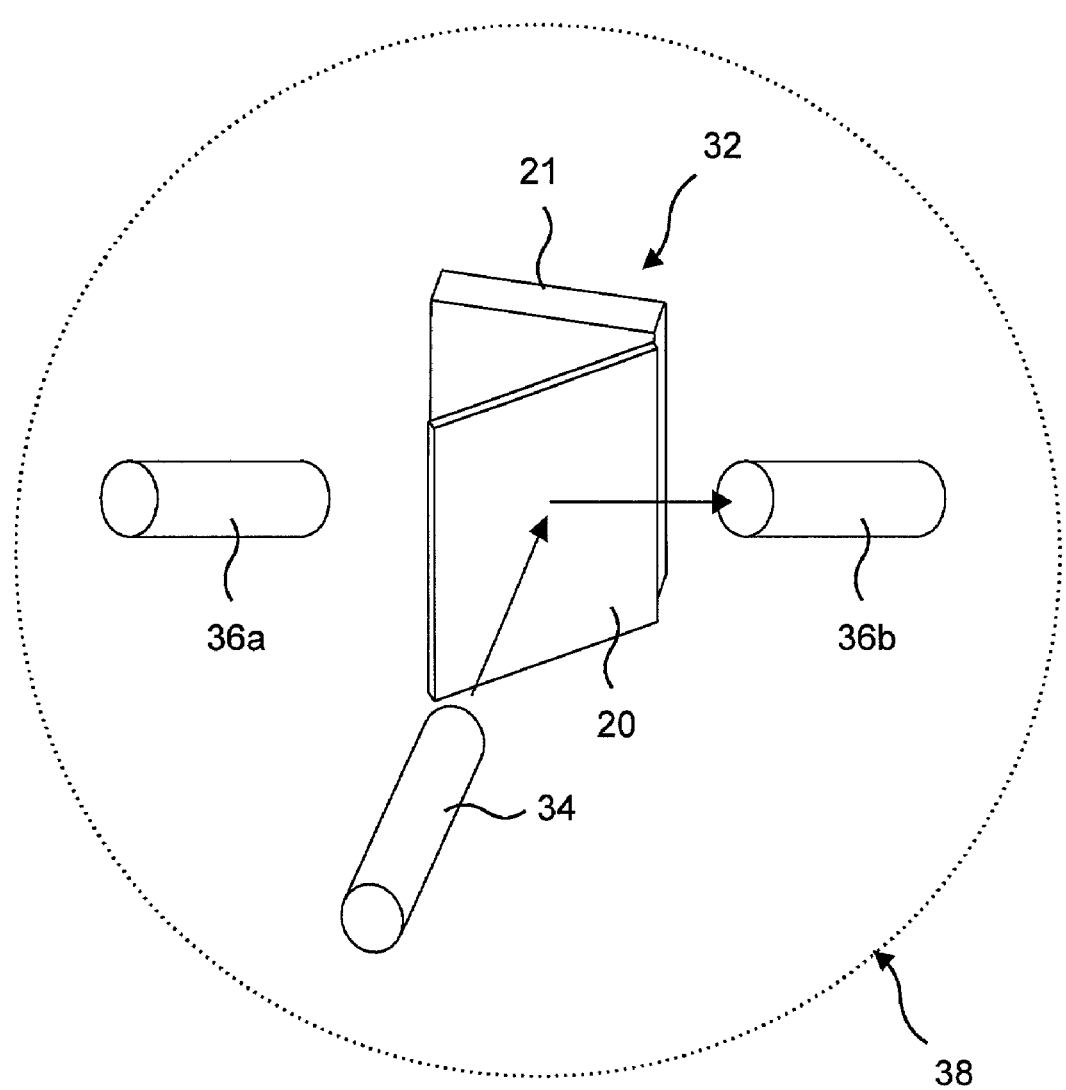

FIGS. 10A and 10B are views for illustrating an operation of an 1×2 optical switching device employing the micromirror device in accordance with another embodiment of the present invention. This micromirror device is rotatable in two directions, and has two rotational driving states. Referring to FIG. 10A, light is incident into a mirror 20 of a micromirror device 32 of the present invention from an input optical fiber 34. When a voltage is applied between one electrode (not shown) formed on a substrate 21 and the mirror 20, an electrostatic force is generated between them by a potential difference. The electrostatic force rotates the mirror 20 to thereby transmit the incident light to a first output optical fiber 36a. Accordingly, the 1×2 optical switching element 38 is realized.

Meanwhile, referring to FIG. 10B, when a voltage is applied between the other electrode (not shown) formed on a substrate 21 and the mirror 20, the mirror 20 is rotated in an opposite direction to that of FIG. 10A, and thereby the incident light is transmitted to a second output optical fiber 36b. It is possible to connect multiple 1×2 optical switching elements, thereby capable of increasing the number of the input and output.

The aforementioned micromirror device can carry out the function corresponding to a unit pixel in an image display device. Also, it is possible to display a high definition image by arranging the micromirror device in a two dimension.

Figure 11:
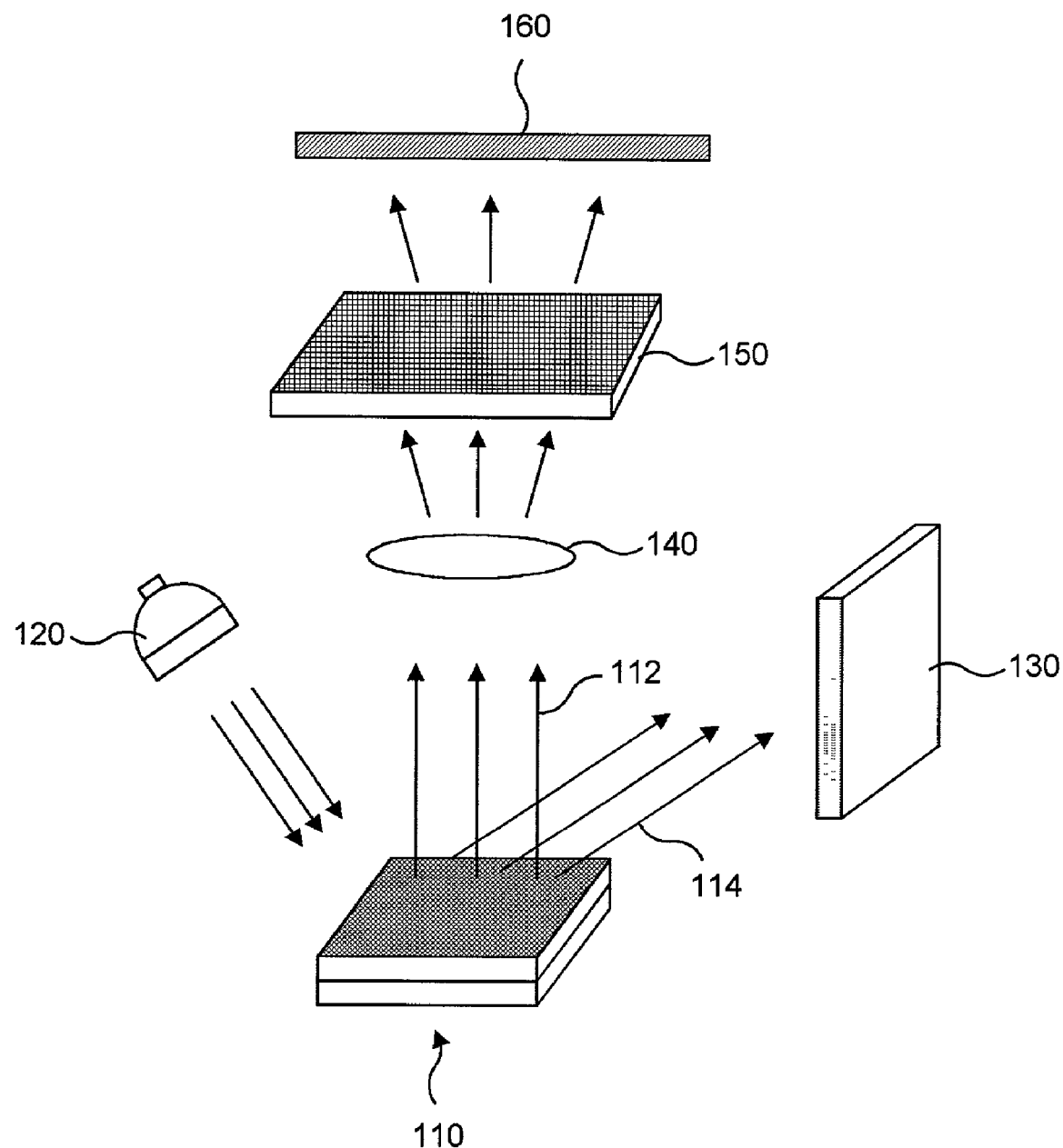
FIG. 11 is a schematic view showing an image display device realized using arrayed micromirror devices in accordance with further another embodiment of the present invention.

FIG. 11 is a schematic view showing an image display device which is realized using arrayed micromirror devices in accordance with further another embodiment of the present invention.

Referring to FIG. 11, a light beam irradiated from a light source 120 is incident into a two-dimensional micromirror array 110 including a driving circuit (not shown). The inputted light beam is reflected to a first optical path 112 or a second optical path 114 depending on a driving state of respective micromirror devices due to a potential difference, decided by the driving circuit, between the address electrodes and the mirror. The light beam reflected to the first optical path 112 by the respective micromirror devices passes through a color filter 150 via a lens 140, so that colors corresponding to color pixels of the color filter 150 are displayed and thereby an image is displayed on a screen 160. On the contrary, the light beam reflected to the second optical path 114 does not travel toward the lens 140 but is absorbed by a light absorbing plate 130, so that a dark image is displayed on the screen 160. Thus, the two dimensional arrangement of the micromirror devices, and the use of the light source 120, the lens 140 and the color filter 150 can be used in a new image display method. This image display method using the arrayed micromirror device enables to obtain a high contrast ratio compared with liquid crystal displays that are representative of flat panel displays. Also, the small size of the micromirror device enables to obtain a high definition image and to obtain a large-sized flat panel display with ease.

In addition, an interdigitated cantilever supporting structure can be utilized in appliances as the switching element in a super high frequency circuit.

As described previously, according to the present invention, it is possible to realize a micromirror device having a simple structure and a low fabrication cost, and its appliances. Further, since the micromirror device has stable rotational states compared with that of the conventional art, an error operation of the micromirror device decreases.

While the present invention has been described in detail, it should be understood that various changes, substitutions and alterations could be made hereto without departing from the spirit and scope of the invention as defined by the appended claims.

What is claimed is:

1. A micromirror device comprising:
   (a) a substrate having left and right sides;
   (b) at least two protruded support posts arranged protrudedly on the left and right sides from a surface of the substrate, the protruded support posts separated by a predetermined interval from each other;
   (c) multiple cantilevers formed substantially parallel to the surface of the substrate, each having two ends, one end being attached at an upper end portion of respective protruded support posts and made in a thin strip having an elastic restoring force, wherein adjacent cantilevers are arranged to be substantially parallel and the cantilevers are interdigitated;
   (d) mirror support posts coupled to upper portions of other ends of the cantilevers;
   (e) a mirror attached on upper portions of the mirror support posts and supported by the mirror support posts; and
   (f) two electrodes formed at the left and right sides on the substrate, for providing an electrostatic force to the mirror,
   wherein the mirror, without pivoting, reflects incident light in different directions based on the electrostatic force due to a voltage applied between the electrodes and the mirror, and based on the elastic restoring force of the cantilevers.

2. The micromirror device of claim 1, wherein a number of the cantilevers is an even number not less than four, and the cantilevers are substantially a same size.

3. The micromirror device of claim 1, wherein a number of the cantilevers is an odd number, a center cantilever of the cantilevers is larger in size than remaining cantilevers, and the remaining cantilevers have substantially a same size.

4. The micromirror device of claim 1, wherein the mirror is made of metal in whole.

5. The micromirror device of claim 1, wherein the mirror is made of a conductive material in whole and comprises a light reflecting surface coated with a metal having a light reflectivity in a single layer or dual layers.

6. The micromirror device of claim 1, wherein the mirror, the mirror support posts, the cantilevers and the protruded support posts are made of a conductive material, and a portion of the electrodes is formed extending directly below the cantilevers.

7. The micromirror device of claim 1, comprising three protruded support posts.

8. The micromirror device of claim 1, wherein each of the at least two protruded support posts has a length greater than a length of corresponding mirror support posts.

9. The micromirror device of claim 1, wherein tilting of the mirror is stopped by an upper surface of the at least two protruded support posts.

10. The micromirror device of claim 1, wherein the cantilevers attached to the protruded support posts arranged on the left side of the substrate and the cantilevers attached to the protruded support posts arranged on the right side of the substrate flex symmetrically when moved by the electrostatic force.

11. An 1×2 optical switching element comprising:
   (a) light input means;
   (b) a micromirror device for reflecting light outputted from the light input means in two different directions, the micromirror device comprising:
   (b-1) a substrate having left and right sides;
   (b-2) at least two protruded support posts arranged protrudedly on the left and right sides from a surface of the substrate, the protruded support posts separated by a predetermined interval from each other;
   (b-3) multiple cantilevers formed substantially parallel to the surface of the substrate, each having two ends one end being attached at an upper end portion of respective protruded support posts and made in a thin strip having an elastic restoring force, wherein adjacent cantilevers are arranged to be substantially parallel and the cantilevers are interdigitated;
   (b-4) mirror support posts coupled to upper portions of other ends of the cantilevers;

(b-5) a mirror attached on upper portions of the mirror support posts and supported by the mirror support posts; and (b-6) two electrodes formed at the left and right sides on the substrate, for providing an electrostatic force to the mirror, wherein the mirror, without pivoting, reflects incident light in different directions based on the electrostatic force due to a voltage applied between the electrodes and the mirror, and based on the elastic restoring force of the cantilevers; and (c) two light output means for outputting the light reflected by the micromirror device.

12. The 1×2 optical switching element of claim 11, wherein the light input means and the light output means are all made of an optical fiber.

13. An n×2n optical switching element comprising:

(a) n-number of light input means;

(b) n-number of arrayed micromirror devices, each micromirror device reflecting light outputted from each of the light input means in two different directions and comprising:

(b-1) a substrate having left and right sides;

(b-2) at least two protruded support posts arranged protrudedly on the left and right sides from a surface of the substrate, the protruded support posts separated by a predetermined interval from each other;

(b-3) multiple cantilevers formed substantially parallel to the surface of the substrate, each having two ends, one end being attached at an upper end portion of the respective protruded support posts and made in a thin strip having an elastic restoring force, wherein adjacent cantilevers are arranged to be substantially parallel and the cantilevers are interdigitated;

(b-4) mirror support posts coupled to upper portions of other ends of the cantilevers;

(b-5) a mirror attached on upper portions of the whole mirror support posts and supported by the mirror support posts; and (b-6) two electrodes formed at the left and right sides on the substrate, for providing an electrostatic force to the mirror, wherein the mirror, without pivoting, reflects incident light in different directions based on the electrostatic force due to a voltage applied between the electrodes and the mirror, and based on the elastic restoring force of the cantilevers; and (c) 2n-number of light output means for outputting the light reflected by each of the micromirror devices.

14. An image display device comprising:

(a) a light source;

(b) two-dimensionally arrayed micromirror devices, each micromirror device comprising:

(b-1) a substrate having left and right sides;

(b-2) at least two protruded support posts arranged protrudedly on the left and right sides from a surface of the substrate, the protruded support posts separated by a predetermined interval from each other;

(b-3) multiple cantilevers formed substantially parallel to the surface of the substrate, each having two ends, one end being attached at an upper end portion of the respective protruded support posts and made in a thin strip having an elastic restoring force, wherein adjacent cantilevers are arranged to be substantially parallel and the cantilevers are interdigitated;

(b-4) mirror support posts coupled to upper portions of other ends of the cantilevers;

(b-5) a mirror attached on upper portions of the mirror support posts and supported by the mirror support posts; and (b-6) two electrodes formed at the left and right sides on the substrate, for providing an electrostatic force to the mirror, wherein the mirror, without pivoting, reflects incident light incident in different directions based on the electrostatic force due to a voltage applied between the electrodes and the mirror, and based on the elastic restoring force of the cantilevers;

(c) a driving circuit for applying an electrical signal to electrodes of the arrayed micromirror devices such that light incident upon the arrayed micromirror devices is selectively reflected along a first path and a second path;

(d) a color filter for revealing colors corresponding to pixels when light reflected along the first path passes through the color filter;

(e) a screen for displaying an image by using light that passes through the color filter; and (f) a light absorbing plate for absorbing light reflected along the second path.

* * * * *